United States Patent [19]
Lothamer et al.

[11] Patent Number: 5,587,568
[45] Date of Patent: Dec. 24, 1996

[54] INTERLOCK SWITCH

[75] Inventors: Thomas J. Lothamer; Carl A. Pontecorvo; Thomas L. Schattke; Richard A. Osterhout, all of Fort Wayne, Ind.

[73] Assignee: ITT Corporation, New York, N.Y.

[21] Appl. No.: 445,085

[22] Filed: May 19, 1995

[51] Int. Cl.⁶ .............................. H01H 1/38; H01H 13/06; H01R 33/06
[52] U.S. Cl. .................. 200/16 R; 200/16 D; 200/51.12; 361/785; 439/358
[58] Field of Search .................................... 200/1 R, 1 A, 200/16 R–16 F, 17 R, 18, 43.04–43.07, 43.09, 50 R, 50.01, 51 R, 51.02–51.12; 361/748, 760, 781, 785; 439/358, 372

[56] References Cited

U.S. PATENT DOCUMENTS

| | | | |
|---|---|---|---|
| 3,491,328 | 1/1970 | Geis, Jr. | 339/66 |
| 4,069,403 | 1/1978 | Beaudette et al. | 200/51.12 |
| 4,746,771 | 5/1988 | Koslar | 200/16 D |

*Primary Examiner*—Brian W. Brown
*Assistant Examiner*—Michael A. Friedhofer
*Attorney, Agent, or Firm*—Plevy & Associates; Patrick M. Hogan

[57] ABSTRACT

An interlock switch for electrically coupling opposing surfaces of a circuit card assembly, wherein each of the surfaces includes a contact pattern defining circuit and switch functions. The interlock switch comprises a pair of contacts which engage the contact patterns on the circuit card assembly to electrically couple the circuits located on the oppositely facing surfaces thereof and a switch body for housing the contacts. The switch body includes a slot for solder-free coupling the switch to an edge of the circuit card assembly. The slot enables the switch to selectively reciprocate among three switch positions on the edge of the circuit card assembly to provide either an open circuit or a closed circuit on the circuit card assembly in any one of three switch positions for each contact. A spring is housed within the switch body for biasing the switch from one of the three positions making it a momentary position. A pair of locking projections are provided for preventing the switch from being easily removed from the edge of the circuit card assembly.

21 Claims, 6 Drawing Sheets

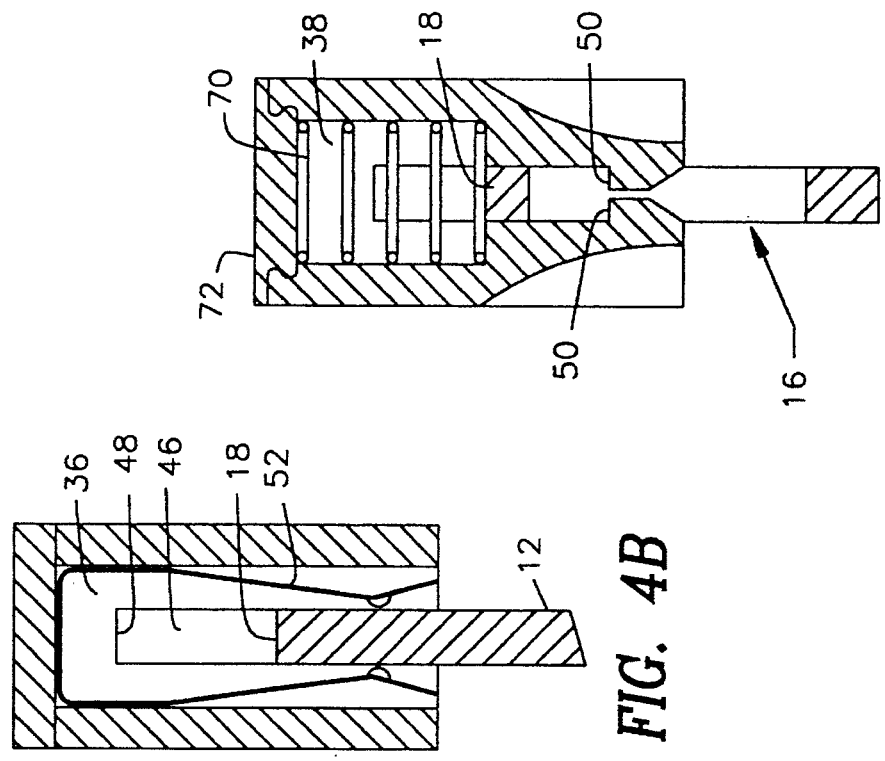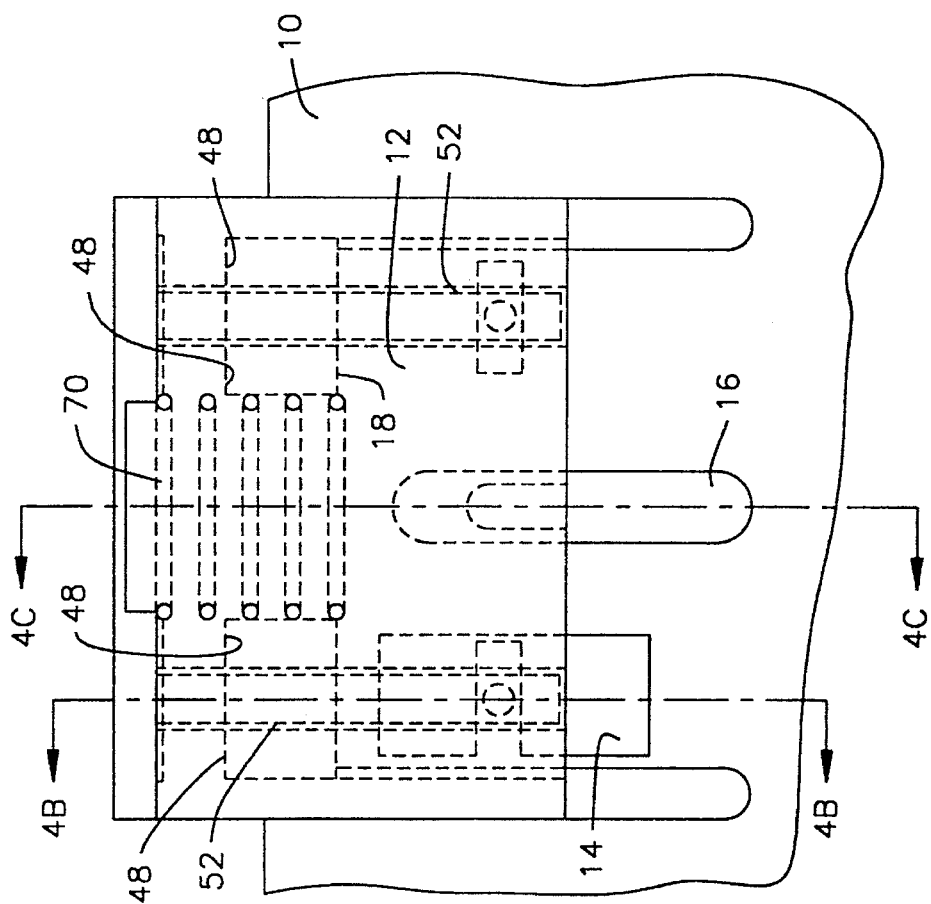

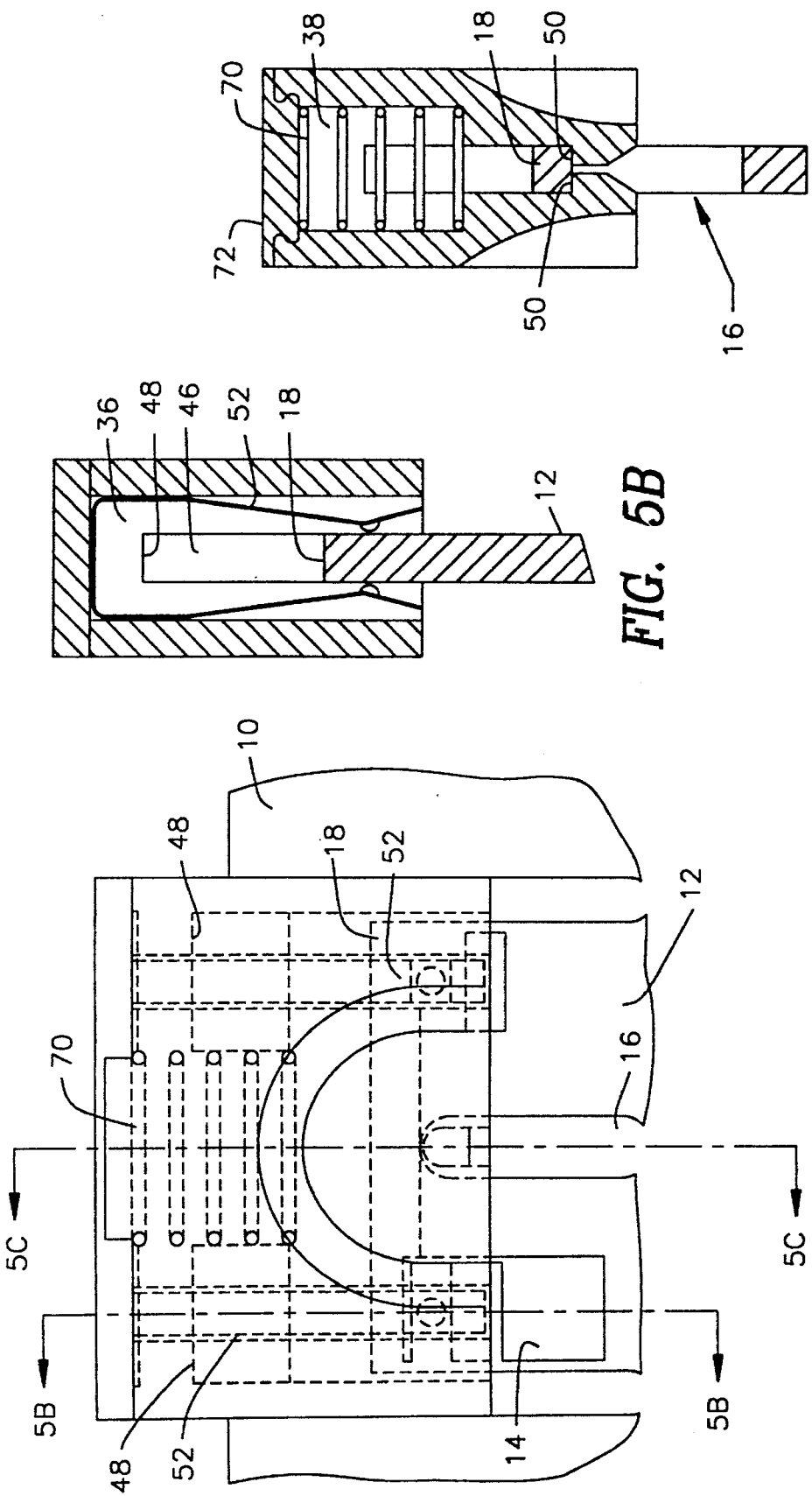

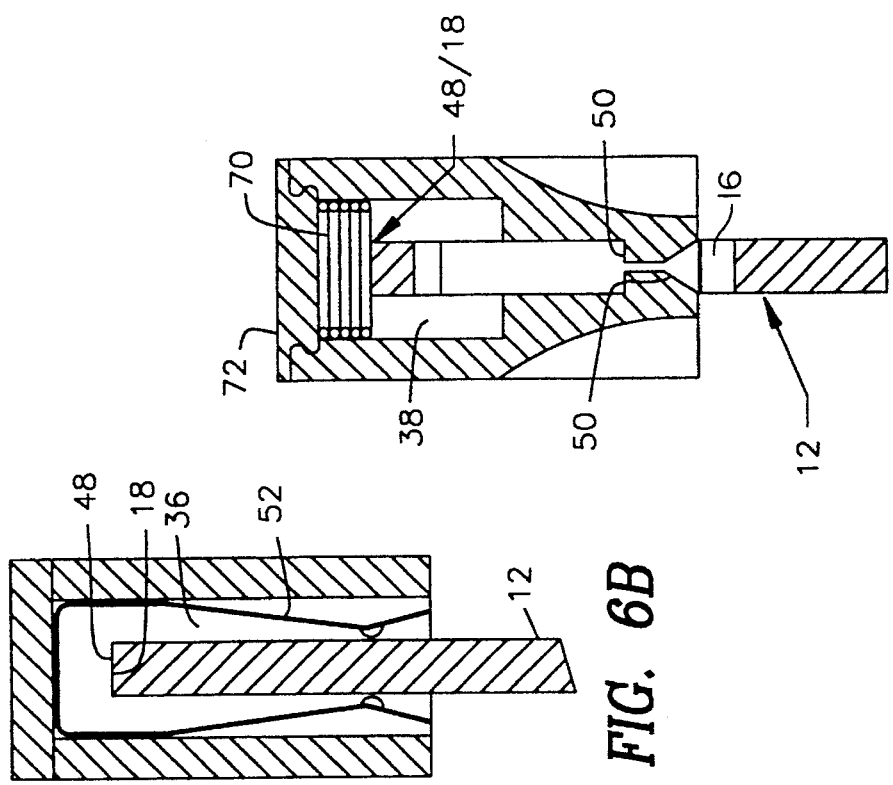
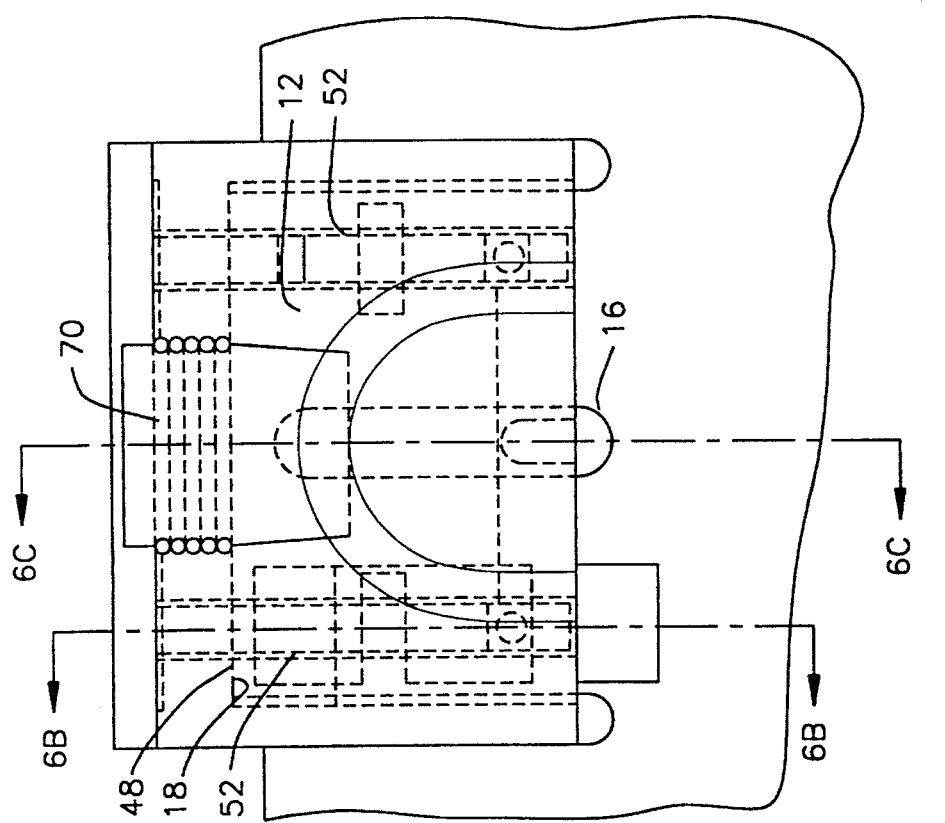

INTERLOCK SWITCH

FIELD OF INVENTION

The present invention relates generally to interlock switches and more particularly to a double pole switch that can be coupled to a circuit card assembly without mounting hardware or soldering.

BACKGROUND OF THE INVENTION

There are many types of interlock switches available on the market today that are utilized in many applications such as circuit card assemblies. These switches utilize a variety of basic switch configurations which typically require additional components to achieve a maintenance position and a wide range of actuation displacement to accommodate application tolerances.

Interlock switches used in circuit card applications must be capable of operating in three distinct positions known in the art as the maintenance position, the normal position, and the actuation zone or position.

When the switch is set in the maintenance position, it must be capable of remaining in this position until it is manually moved into one of the two other positions.

A switch that is set in the actuation zone or position must be capable of returning to the normal position from the actuation zone or position described below, when actuation forces are removed from the switch. The switch must also pass through the normal position when traveling from the maintenance position to the actuation zone or position.

When the switch is set in the actuation zone the switch must be capable of automatically returning to the normal position when the switch is released. Thus, the actuation zone is basically a momentary position. Further, this position is described as a "zone" because a wide range of actuation displacement is required in order to accommodate application tolerances.

Prior art interlock switches are plagued with a number of shortcomings when implemented on a circuit card assembly. For example, prior art interlock switches consume a significant amount of area on the circuit card assembly. This area can typically be on the order of approximately 1.09 square inches.

Typical prior art interlock switches have other shortcomings as well. Prior art interlock switches are relatively expensive to produce in high volume where they typically cost approximately $10.00 a piece. Moreover, these devices use a slider action where the frictional forces result from normal (perpendicular) forces generated by the basic switch. These frictional forces can create problems if the sliding surface finishes as well as the assembly geometry are not carefully controlled. Hence, the design reliability of such devices is manufacturing process sensitive. Further, since prior art interlock switches must be soldered to the circuit card assembly, they must go through post solder cleaning. This exposes the basic switch contacts to contamination from cleaning solvents unless the switch happens to be a sealed unit. In certain contact arrangements, the contacts are susceptible to intermittence after exposure to such contaminants. Still further, the soldering operation including the necessary mounting hardware for installing the prior art switches to circuit card assemblies is costly. The total part count in prior art switches can typically be 25 to 30 parts. Finally, the circuit configurations controlled by prior art interlock switches are limited by the electrical function of the basic switch. Many of these switches are double pole single throw switches where only one circuit can be completed for each pole.

It is, therefore, an object of the present invention to provide an improved interlock switch that eliminates the aforementioned shortcomings of the prior art interlock switches.

SUMMARY OF THE INVENTION

An interlock switch for use on a circuit card assembly having oppositely facing surfaces, each of the surfaces having a contact pattern which defines circuit and switch functions. The switch comprises contact means for engaging the contact patterns to electrically couple the circuits on the oppositely facing surfaces of the circuit card assembly and switch body means for housing the contact means. The switch body means includes slot means for solder-free coupling the switch to an edge of the circuit card assembly. The slot means enables the switch to selectively reciprocate among three switch positions on the edge of the circuit card assembly to electrically couple and uncouple the circuits on the oppositely facing surfaces of the circuit card assembly in any one of the three positions by connecting the contact patterns on the oppositely facing surfaces of the circuit card assembly with the contact means.

Spring means are housed within the switch body means for biasing the switch in one of the three positions and locking projection means are provided for retaining the switch to the edge of the circuit card assembly in a second one of the three positions.

BRIEF DESCRIPTION OF THE DRAWINGS

For a detailed understanding of the present invention, reference should be made to the following detailed description taken in conjunction with the accompanying drawings wherein:

FIG. 4A is a front elevational view of the switch coupled to the circuit card assembly shown set in the normal position;

FIG. 4B is a cross-sectional side view through line 4B—4B in FIG. 4A;

FIG. 4C is a cross-sectional side view through line 4C—4C in FIG. 4A;

FIG. 5A is a front elevational view of the switch coupled to the circuit card assembly shown set in the maintenance position;

FIG. 5B is a cross-sectional side view through line 5B—5B in FIG. 5A;

FIG. 5C is a cross-sectional side view through line 5C—5C in FIG. 5A;

FIG. 6A is a front elevational view of the switch coupled to the circuit card assembly shown set to the maximum compressed limit of the actuation zone;

FIG. 6B is a cross-sectional side view through line 6B—6B in FIG. 6A; and

FIG. 6C is a cross-sectional side view through line 6C—6C in FIG. 6A.

DETAILED DESCRIPTION OF THE INVENTION

All references made to orientation in terms of top, bottom, front, rear, etc., in the description which follows, are made for illustrative purposes only and are not intended to be limiting.

Figure 1A:
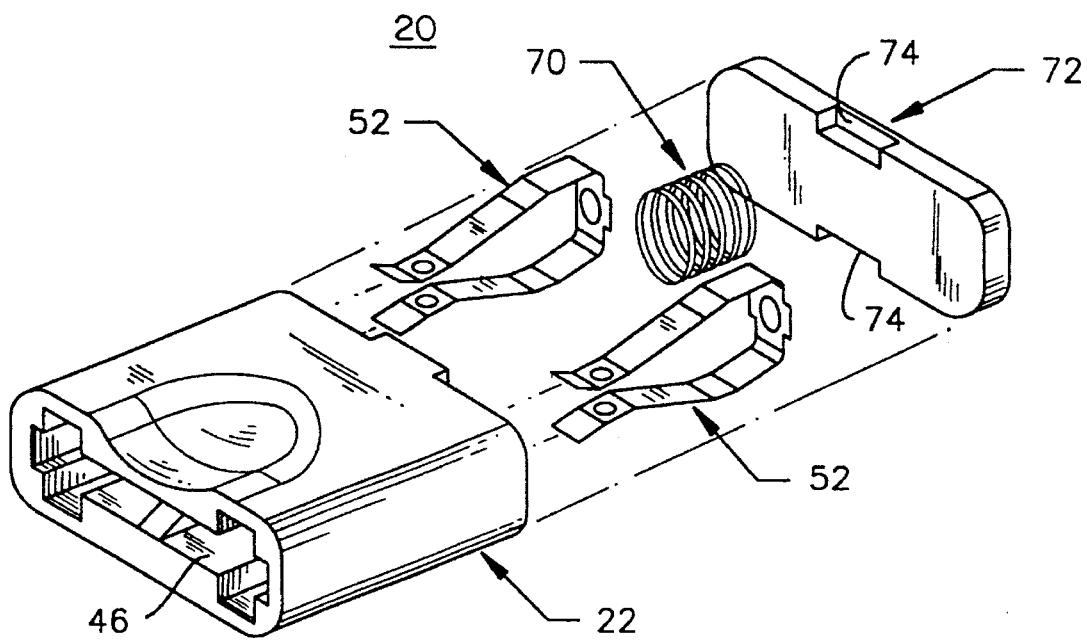
FIG. 1A is an exploded perspective view of an exemplary embodiment of the switch of the present invention.
Figure 1B:
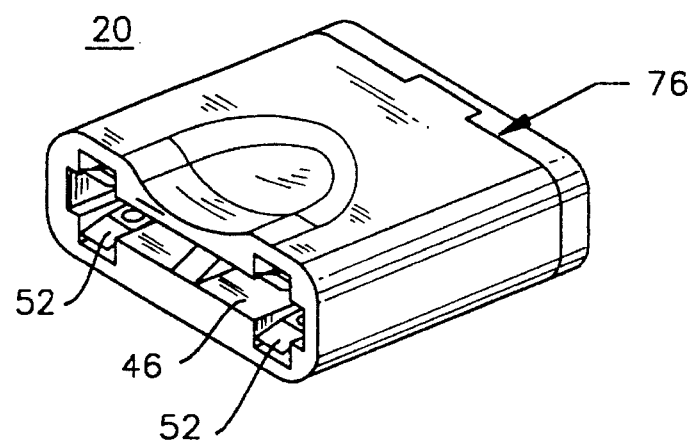
FIG. 1B is an assembled view of the switch shown in FIG. 1A.

Referring to FIGS. 1A and 1B, an exemplary embodiment of the interlock switch 20 of the present invention is shown. As can be seen in the exploded perspective view of FIG. 1A, the interlock switch 20 of the present invention is a double pole single throw switch comprising 5 easily assembled prefabricated components which consist of a switch body 22 and lid 72 which houses a pair of metal contacts 52 and a coil spring 70. The switch 20 is assembled by installing the contacts 52 and the coil spring 70 into the switch body 22 from the top where they are held in place by the lid 72. The lid 72 is non-removably bonded at 76 to the switch body using any conventional bonding technique such as adhesive bonding or the like. When assembled, the interlock switch 20 of the present invention takes up significantly less area on a circuit card assembly. Further, when manufactured in volume, the interlock switch 20 of the present invention can be produced for substantially less than comparable prior art interlock switches that are presently available.

Figure 1C:
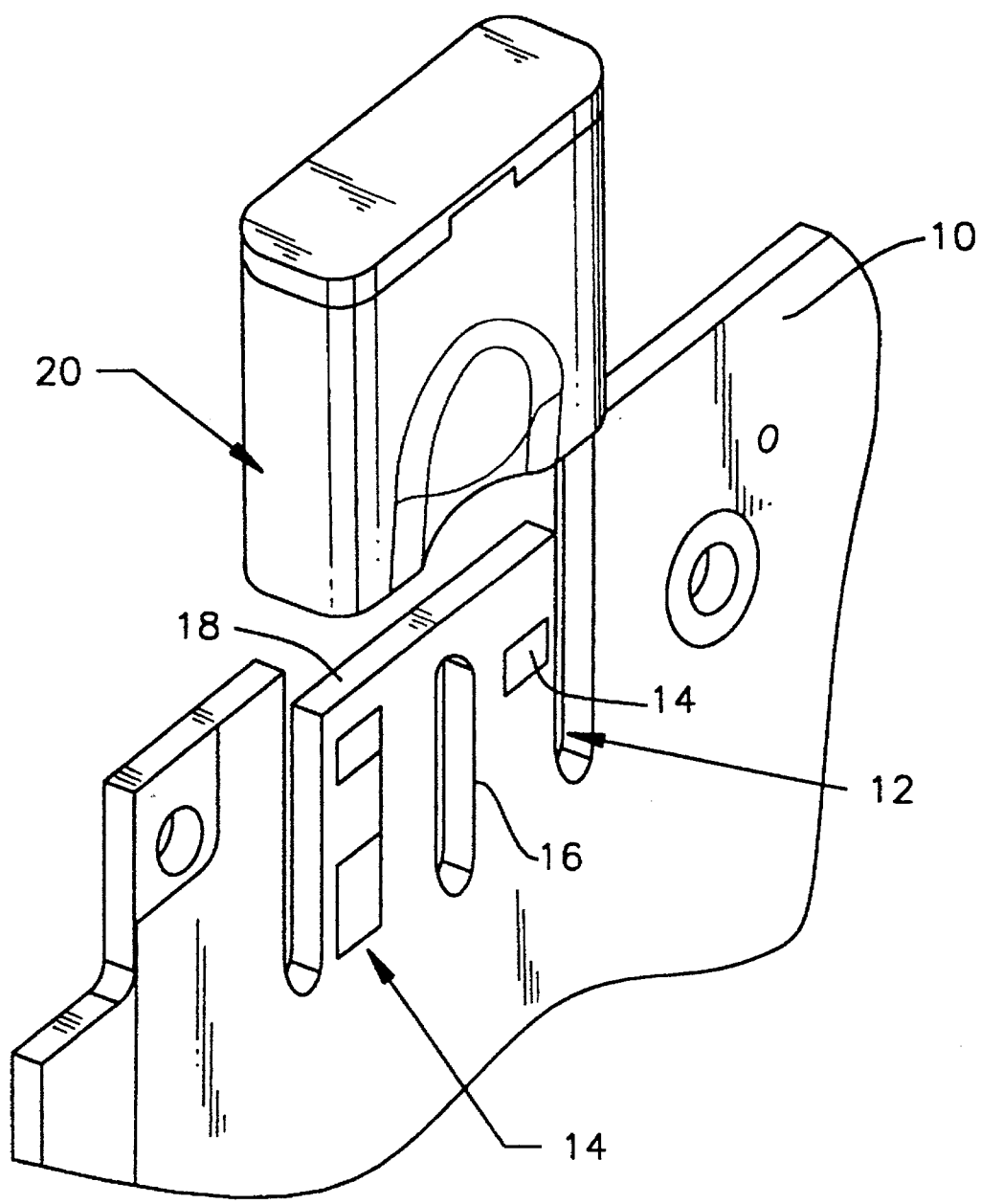
FIG. 1C depicts how the switch of the present invention is mounted to the edge of a circuit card assembly.

As shown in the assembled view of FIG. 1B, the ends of the contacts 52 are accessible through a slot 46 in the bottom surface 34 of the switch body 22 which enables the switch 20 to be electrically coupled to a circuit card assembly. The contacts 52 employed in the switch 20 are of a wiping design and operate as an electrical jumper to electrically couple circuits located on one side of the circuit card assembly to circuits located on the other side of the circuit card assembly. The novel construction of the switch allows it to be mounted by hand to the edge 18 of the circuit card assembly 10 on a tab-shaped portion 12 without any additional mounting hardware, special tools or soldering as shown in FIG. 1C. The slot 46 in the bottom surface 34 of the switch body 22 is sized to receive the tab-shaped portion 12 of the circuit card assembly 10. Each side of the tab-shaped portion 12 defines a pair of contact patterns 14 which correspond to the circuits (not shown) located on each side of the circuit card assembly 10. The contacts 52 engage different segments of the patterns 14 as the switch 20 reciprocates up and down on the tab 12 as will be explained. Since it is not necessary to solder the switch 20 to the card assembly 10, it may be installed after all the other circuit card assembly soldering processes have been completed. Thus, the switch 20 is never required to be exposed to potentially harmful solder cleaning solvents. Moreover, the wiping action of the contacts 52 will clean the points of the contacts as the switch is operated. If it should become desirable to remove the switch from the circuit card assembly, quick and non-destructive removal is possible by using a special tool (not shown).

The interlock switch 20 of the present invention is constructed to operate in three positions: the maintenance position; the normal position; and the actuation position or zone. When the switch 20 is manually placed in the maintenance position, the switch construction enables it to remain in this position indefinitely until it is placed in one of the other two positions. When the switch 20 is operated from the normal position to the actuation zone or position, the novel construction of the switch 20 automatically returns it to the normal position from the actuation zone when the user removes actuation forces from the switch 20. Moreover, the switch 20 will pass through the normal position when traveling from the maintenance position to the actuation zone. The actuation position or zone is described as such because a wide range of actuation displacement is required to accommodate various application tolerances. The actuation zone is a momentary position because the switch 20 is designed to return to the normal position when released. Accordingly, each contact 52 of the switch 20 of the present invention will provide either an open or a closed circuit for each of the three switch positions depending on the shape of the contact patterns on the circuit card assembly. This allows many different circuit configurations to be attained in each of the three switch positions. The circuit card assembly 10 shown in FIG. 1C allows the switch 20 to operate as a double pole single throw switch. It is possible, however, to achieve various other circuit combinations for each of the three switch positions by simply modifying the circuit board design of the circuit card assembly.

Figure 2A:
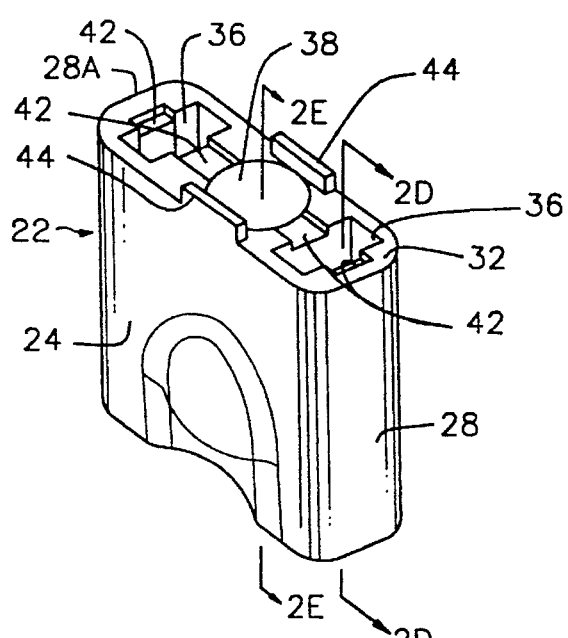
FIG. 2A is a perspective view of the switch body.
Figure 2B:
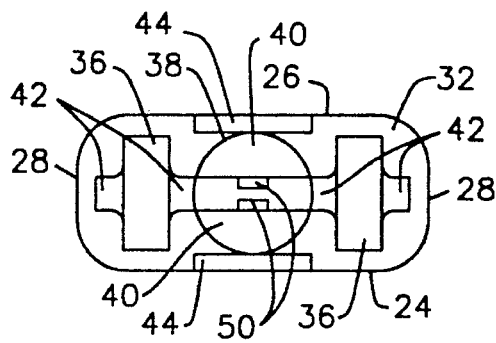
FIG. 2B is a top view of the switch body.
Figure 2C:
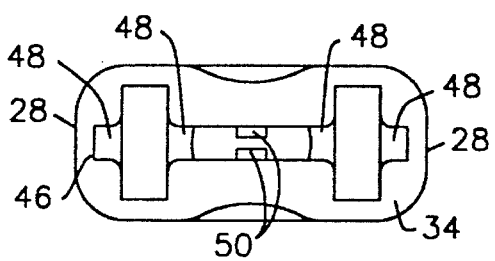
FIG. 2C is a bottom view of the switch body.

Referring now to FIGS. 2A–2C, the exterior of the switch body 22 has a generally rectangular shape with a front surface 24 and a rear surface 26 which both curve around and merge into a pair of side surfaces 28. The top of the switch body includes a planar lid mounting surface 32 and the bottom of the switch body includes a planar bottom surface 34. A pair of rectangularly-shaped projections 44 extend up from the perimeter of the lid mounting surface 32. The projections 44 are received by a pair of correspondingly shaped recesses 74 which are defined in the bottom surface of the lid 72 as can be seen in FIG. 1B. The projections 44 engage the recesses 74 in the lid 72 as shown in FIG. 1A to mechanically align the lid 72 with the switch body 22 during lid-to-switch body bonding.

Referring again to FIGS. 2A–2C, the switch body 22 defines a pair of rectangular apertures 36 that extend between the lid mounting surface 32 and the bottom surface 34 of the switch body 22. Each rectangular aperture 36 receives one of the two earlier described contacts 52. Disposed between the pair of rectangular apertures 36 is a bore 38 which receives the earlier described compression spring 70. A plurality of recessed contact seats 42 are also defined in the lid mounting surface 32, each contact seat 42 being located immediately adjacent to each long side of each rectangular aperture 36. The contact seats 42 receive correspondingly-shaped seating flange portions 56 formed on the contacts 52 to be described later on.

Figure 2D:
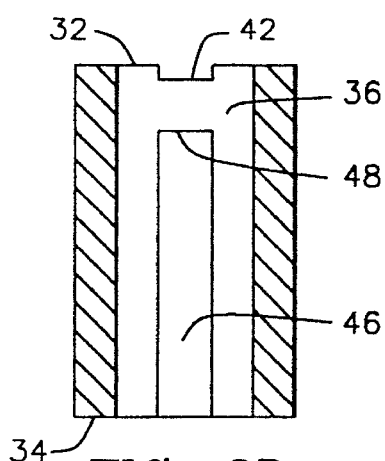
FIG. 2D is a cross-sectional side view through line 2D—2D of the switch body shown in FIG. 2A.

The rectangular apertures 36 are separate from each other and the bore 38 as they extend through a relatively small portion of the switch body 22 from the lid mounting surface 32 as shown in FIGS. 2A and 2B. Then, each aperture 36 merges with the earlier described slot 46 where they continue down to the bottom surface 34 of the switch body 22. This can be best visualized by referring to FIG. 2D which shows a cross-sectional view through one of the rectangular apertures 36 along line 2D—2D of FIG. 2A. As shown therein, the upper most wall of the slot 46 where the aperture 36 and the slot 46 merge defines a stop 48. FIG. 2C allows a view of this structure through the slot 46 from the bottom surface 34 thereof. As shown therein, four stops 48 are defined at the merger of the slot 46 and the rectangular apertures 36 the purpose of which will be explained later.

Figure 2E:
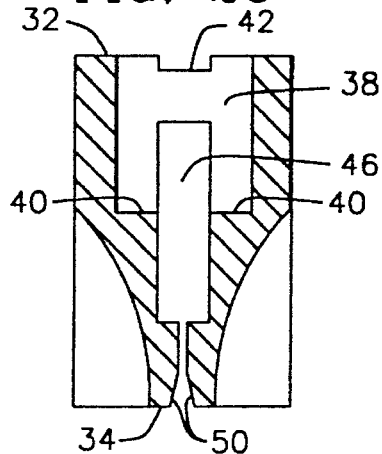
FIG. 2E is a cross-sectional side view through line 2E—2E of the switch body shown in FIG. 2A.

The bore 38 extends into the switch body 22 from the lid mounting surface 32 a given distance where it merges with the slot 46 as best seen in FIG. 2E which depicts a cross-sectional view through the bore 38 along the line 2E—2E of FIG. 2A. As shown therein, the merger of the bore 38 and the slot 46 divides the bottom wall 40 of the bore 38 into two sections which operate collectively as a spring seat (also visible in FIG. 2B). Further, a pair of locking projections 50 extend into the slot 46 from the switch body 22. The locking projections 50 ride in an elongated slot 16 in the circuit card assembly 10 as shown in FIG. 1C and prevent the switch 20 from sliding off the circuit card assembly 10 when the switch 20 is in the maintenance position.

Figure 3A:
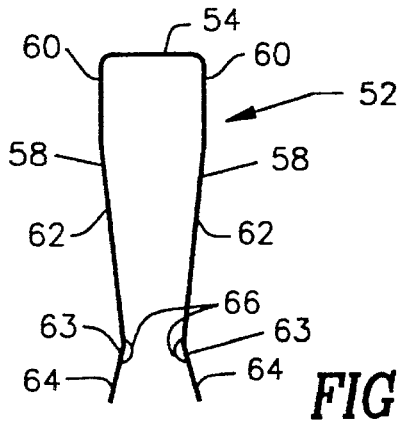
FIG. 3A is a front elevational view of one of the contacts.
Figure 3B:
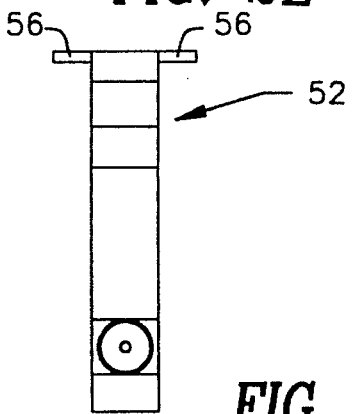
FIG. 3B is a side elevational view of the contact shown in FIG. 3A.

Referring to FIG. 3A, each metal contact 52 used in the switch 20 of the present invention is generally U-shaped and comprises a horizontal top 54 and a pair of depending arms 58. The horizontal top 54 of each metal contact 52 includes a pair of oppositely extending flanges 56 as shown in FIG. 3B. In FIG. 3A, each arm 58 has a vertical portion 60 an inwardly tapering portion 62, a short vertical portion 63 and a short outwardly tapering portion 64. Each short vertical portion 63 includes an inwardly extending dimple 66. The inwardly extending dimples 66 define a pair of opposing contact surfaces or points. When the switch 20 is coupled to the circuit card assembly 10 shown in FIG. 1C, the arms 58 of the contacts 52 spread slightly to receive the tab portion 12 of the circuit card assembly 10. A spring bias develops when the arms 58 of the contacts 52 are spread. The spring bias maintains electrical contact between the contact points 66 as they slidingly engage the circuit card assembly 10 during switching of the switch 20.

Each contact 52 is positioned within its respective rectangular aperture 36 as best shown in FIGS. 4B, 5B and 6B. The contact arms 58 extend the entire length of the aperture 36 so that the outwardly tapering end portions 64 thereof terminate just before the opening of the slot 46 in the bottom surface 34 of the switch body 22 as shown in FIG. 1B. The flanges 56 on each contact 52 sit in their respective contact seats 42 to orient the horizontal top 54 of each contact 52 flush with the lid mounting surface 32. Hence, the bottom surface of the lid 72 can be directly bonded to the lid mounting surface 32 of the switch body 22. The contact flanges 56 prevent the contacts 52 from sliding around in their respective apertures 36 as the switch 20 is operated.

The coil spring 70 has an uncompressed length that is slightly greater than the depth of the bore 38 so that the when the lid 72 is bonded to the switch body 22, the coil spring 70 is held under a slight compression within the switch body 22. The coil spring 70 operates to return the switch 20 from the actuation zone to the normal position with a force controlled by the slight compression described above, when the actuation force is removed.

FIGS. 4A–4C, show the switch of the present invention coupled to the circuit card assembly 10 of FIG. 1C and set in the normal position. A front elevational view of the switch 20 in the normal position is shown in FIG. 4A. In this Figure the internal structures of the switch and the enclosed portions of the circuit card tab 12 are shown with broken lines. In the normal position, the bottom of the spring 70 rests on the top edge 18 of circuit card tab 12. The spring 70 also places the spring force on the underside of the switch lid 72 which will minimize any possibility of binding or jamming as the switch 20 travels from the actuation zone to the normal position. In most applications of the switch 20, this motion will be most critical. The internal structure of the switch 20 relative to the circuit card assembly 10 can be seen more clearly in the cross-sectional views of FIGS. 4B and 4C which have been taken along lines 4B—4B and 4C—4C of FIG. 4A.

FIGS. 5A–5C, show the switch 20 of the present invention set in the maintenance position. In the maintenance position, the locking projections 50 are fully engaged with the top end of the elongated slot 16 and retained in this position by the frictional force applied by the contacts 52. Note that since the spring 70 is no longer engaged with the tab 12 of the circuit card assembly 10, motion from the normal position to the maintenance position can only be achieved manually by pulling the switch 20 up.

FIGS. 6A–6C, show the switch 20 of the present invention set at the bottom limit of the actuation zone. The bottom limit of the actuation zone is defined by the point where the top edge 18 of the tab 12 engages the stops 48 in the switch body 22. When this occurs the spring 70 is fully compressed. The upper limit of the actuation zone is defined by the circuit design 14 and generally starts sometime after the switch 20 has been pushed to compress the spring 70 from the normal position. When the spring 70 is compressed, it returns the switch 20 to the normal position upon the release of the switch 20 by the user.

As one of ordinary skill in the art will appreciate, the method for guiding the switch 20 through its displacement has no normal forces associated therewith, except for the contact force itself. This parameter of force is much less sensitive to manufacturing process variability than the force parameters associated with the prior art designs.

Although the switch of the present invention may be used with generally any assembly requiring an interlock switch for safety or security, it is especially useful for circuit board applications. Further, other applications which are capable of mounting the switch of the present invention are also contemplated.

It should be understood that the embodiment described herein is merely exemplary and that a person skilled in the art may make many variations and modifications to the embodiment utilizing functionally equivalent elements to those described herein. Any and all such variations or modifications as well as others which may become apparent to those skilled in the art, are intended to be included within the scope of the invention as defined by the appended claims.

We claim:

1. An interlock switch for use on a circuit card assembly having oppositely facing surfaces, each of said surfaces having a contact pattern defining circuit and switch functions, comprising:

contact means for engaging said contact patterns to electrically couple said circuits on said oppositely facing surfaces of said circuit card assembly;

switch body means for housing said contact means, said switch body means including slot means for solder-free coupling said switch to an edge of the circuit card assembly, said slot means enabling said switch to selectively reciprocate among a first switch position, a second switch position, and a third switch position, on the edge of the circuit card assembly to electrically couple and uncouple said circuits on said oppositely facing surfaces of said circuit card assembly in any one of said switch positions by connecting said contact patterns on said oppositely facing surfaces of said circuit card assembly with said contact means;

spring means housed within said switch body means for biasing said switch from said third switch position; and locking projection means for preventing said switch from being easily removed from the edge of the circuit card assembly.

2. The interlock switch according to claim 1, wherein said third switch position comprises an actuation zone of a predetermined range and said switch body means includes stop means for limiting said predetermined range of said actuation zone of said switch.

3. The interlock switch according to claim 1, wherein said contact means comprises at least one generally U-shaped contact having a pair of arms separated by a connecting member, wherein said arms each have an inwardly tapering portion which merges into an outwardly tapering portion, whereby said arms are spread apart by the circuit card assembly thereby exerting a spring bias thereon to maintain contact with said contact patterns on said circuit card assembly and provide a frictional force to hold said switch in any one of said first and second switch positions.

4. The interlock switch according to claim 1, wherein said contact means are disposed in at least one aperture defined by said switch body means.

5. The interlock switch according to claim 4, wherein said at least one aperture merges with said slot means.

6. The interlock switch according to claim 1, wherein said spring means are disposed in a bore defined by said switch body means.

7. The interlock switch according to claim 6, wherein said slot means extends into said bore.

8. An interlock switch for electrically coupling opposing surfaces of a circuit card assembly, each of said surfaces having a contact pattern defining circuit and switch functions, comprising:

a pair of contacts for engaging said contact patterns to electrically couple said circuits on said oppositely facing surfaces of said circuit card assembly;

a switch body having first and second surfaces for housing said contacts, said first surface which includes a slot for solder-free coupling said switch to an edge of the circuit card assembly, said slot enabling said switch to selectively reciprocate among a first switch position, a second switch position, and a third switch position, on the edge of the circuit card assembly to electrically couple and uncouple said circuits on said oppositely facing surfaces of said circuit card assembly in any one of said switch positions by connecting said contact patterns on said oppositely facing surfaces of said circuit card assembly with said contacts;

a spring housed within said switch body for biasing said switch from said third switch position; and a pair of locking projections for preventing said switch from being easily removed from the edge of the circuit card assembly.

9. The interlock switch according to claim 8, wherein said third switch position comprises an actuation zone of a predetermined range and said switch body defines an internally located stop for limiting said predetermined range of said actuation zone of said switch.

10. The interlock switch according to claim 8, wherein each of said contact is generally U-shaped having a pair of arms separated by a connecting member, wherein said arms each have an inwardly tapering portion which merges into an outwardly tapering portion, whereby said arms are spread apart the circuit card assembly thereby exerting a spring bias thereon to maintain contact with said contact patterns on said circuit card assembly and to provide a frictional force to hold said switch in any one of the first and second switch positions.

11. The interlock switch according to claim 8, wherein each of said contacts are disposed in corresponding apertures defined between said first and second surfaces of said switch body.

12. The interlock switch according to claim 11, wherein each of said apertures merge with said slot.

13. The interlock switch according to claim 8, wherein said spring is disposed in a bore which extends into said switch body from said second surface.

14. The interlock switch according to claim 13, wherein said slot extends into said bore.

15. An interlock switch electrically coupled to a circuit card assembly having oppositely facing surfaces, each of said surfaces having a contact pattern defining circuit and switch functions, comprising:

at least one contact for engaging said contact patterns to electrically couple said circuits on said oppositely facing surfaces of said circuit card assembly;

a switch body for housing said at least one contact, said switch body including a slot for solder-free coupling said switch to an edge of said circuit card assembly, said slot receiving a portion of said circuit card assembly to thereby enable said switch to selectively reciprocate among a first switch position, a second switch position, and a third switch position, on said edge of said circuit card assembly to electrically couple and uncouple said circuits on said oppositely facing surfaces of said circuit card assembly in any one of said switch positions by connecting said contact patterns on said oppositely facing surfaces of said circuit card assembly with said at least one contact;

a spring housed within said switch body for biasing said switch from said third switch position wherein said spring engages said edge of said circuit card assembly; and a pair of locking projections coacting with an elongated slot in said circuit card assembly to prevent said switch from being easily removed from said edge of said circuit card assembly.

16. The interlock switch and circuit card assembly according to claim 15, wherein said third switch position comprises an actuation zone of a predetermined range and said switch body defines an internally located stop which engages said edge of said circuit card assembly in said third position to limit said predetermined range of said actuation zone of said switch.

17. The interlock switch and circuit card assembly according to claim 15, wherein said at least one contact is generally U-shaped having a pair of arms separated by a connecting member, wherein said arms each have an inwardly tapering portion which merges into an outwardly tapering portion, whereby said arms are spread apart by the circuit card assembly thereby exerting a spring bias thereon to maintain contact with said contact patterns on said circuit card assembly and provide a frictional force to hold said switch in any one of said first and second switch positions.

18. The interlock switch and circuit card assembly according to claim 15, wherein said at least one contact is disposed in an aperture defined in said switch body.

19. The interlock switch and circuit card assembly according to claim 18, wherein said aperture merges with said slot.

20. The interlock switch and circuit card assembly according to claim 15, wherein said spring is disposed in a bore which extends into said switch body.

21. The interlock switch and circuit card assembly according to claim 20, wherein said slot extends into said bore.

* * * * *